(12) United States Patent
Yang et al.

(10) Patent No.: US 11,282,969 B2
(45) Date of Patent: *Mar. 22, 2022

(54) BACK CONTACT SOLAR CELL ASSEMBLIES

(71) Applicant: SolAero Technologies Corp., Albuquerque, NM (US)

(72) Inventors: Lei Yang, Albuquerque, NM (US); Daniel McGlynn, Albuquerque, NM (US)

(73) Assignee: SolAero Technologies Corp., Albuquerque, NM (US)

( * ) Notice: Subject to any disclaimer, the term of this patent is extended or adjusted under 35 U.S.C. 154(b) by 24 days.

This patent is subject to a terminal disclaimer.

(21) Appl. No.: 16/922,659

(22) Filed: Jul. 7, 2020

(65) Prior Publication Data

US 2020/0335646 A1    Oct. 22, 2020

Related U.S. Application Data

(62) Division of application No. 15/681,112, filed on Aug. 18, 2017, now Pat. No. 10,749,051.

(51) Int. Cl.
*H01L 31/0224*  (2006.01)
*H01L 31/05*  (2014.01)

(52) U.S. Cl.
CPC ...... *H01L 31/022441* (2013.01); *H01L 31/05* (2013.01)

(58) Field of Classification Search
CPC ..... Y02E 10/50; Y02E 10/544; H01L 31/042; H01L 31/044; H01L 31/0443; H01L 31/048; H01L 31/0504; H01L 31/0508; H01L 31/0687; H01L 31/0725; H01L 31/074

See application file for complete search history.

(56) References Cited

U.S. PATENT DOCUMENTS

| | | | |
|---|---|---|---|
| 6,248,948 B1* | 6/2001 | Nakagawa | H01L 31/042 136/244 |
| 6,563,289 B1* | 5/2003 | Cross | H01L 27/142 136/256 |
| 2005/0051204 A1* | 3/2005 | Oi | H01L 31/048 136/251 |
| 2009/0288702 A1* | 11/2009 | Kim | H01L 31/02 136/251 |
| 2013/0224906 A1* | 8/2013 | Biro | H01L 31/022425 438/98 |
| 2016/0218665 A1* | 7/2016 | Crist | H01L 31/0504 |
| 2016/0226182 A1* | 8/2016 | Szeto | H01R 43/20 |
| 2018/0076761 A1* | 3/2018 | Rehder | H01L 31/0516 |

* cited by examiner

*Primary Examiner* — Mayla Gonzalez Ramos

(57) ABSTRACT

A back contact solar cell assembly and methods for its manufacture and assembly onto a panel for use in space vehicles are described. The solar cell assembly includes a compound semiconductor multijunction solar cell having a contact at the top surface of the solar cell, a conductive semiconductor element extending from the contact on the top surface to the back surface of the assembly where it forms a first back contact of a first polarity type, and a second back contact of a second polarity at the back surface of the assembly electrically coupled to the back surface of the solar cell.

19 Claims, 13 Drawing Sheets

BACK CONTACT SOLAR CELL ASSEMBLIES

REFERENCE TO RELATED APPLICATIONS

This application is a division of U.S. patent application Ser. No. 15/681,112 filed Aug. 18, 2017. This application is related to U.S. patent application Ser. No. 14/485,378, filed Sep. 12, 2014, which in turn was a continuation-in-part of U.S. patent application Ser. No. 13/604,833, filed Sep. 6, 2012, which in turn was a continuation-in-part of U.S. patent application Ser. No. 12/637,241, filed Dec. 14, 2009, which in turn was a continuation-in-part of U.S. patent application Ser. No. 11/616,596, filed Dec. 27, 2006, and Ser. No. 12/544,001, filed Aug. 19, 2009.

This application is also related to U.S. patent application Ser. No. 15/372,086, filed Dec. 7, 2016.

This application is related to U.S. patent application Ser. No. 14/729,422, filed Jun. 3, 2015.

This application is also related to U.S. patent application Ser. No. 15/439,405, filed Feb. 22, 2017, which is a continuation-in-part of U.S. application Ser. No. 14/334,878, filed Jul. 18, 2014.

This application is related to co-pending U.S. patent application Ser. No. 15/170,269 filed Jun. 1, 2016.

This application is also related to co-pending U.S. patent application Ser. No. 15/241,418 filed Aug. 19, 2016.

All of the above related applications are incorporated herein by reference in their entirety.

BACKGROUND OF THE INVENTION

1. Field of the Invention

The present invention relates to the field of solar cell arrays and in particular to back contact solar cells and arrays of such solar cells for space/aviation applications and methods for their fabrication.

2. Description of the Related Art

Conventional space solar array panels at present are most often comprised of a relatively densely packed arrangement of solar cells generally the size of the semiconductor wafer (typically 100 or 150 mm in diameter) mounted on a rigid supporting panel. A conventional space solar array panel may include a panel or support, solar cell assemblies disposed on the support, interconnection components for connecting the solar cell assemblies, bypass diodes and blocking diodes also connected to the solar cells, and electrical terminals for attachment of a cable or harness to transfer the power to a power management distribution system and the spacecraft power bus.

Individual solar cells, frequently with a rectangular or generally square-shape and sometimes with cropped corners, are connected in series to form a string of solar cells, whereby the number of solar cells used in the string determines the output voltage. Solar cells or strings of solar cells can also be interconnected in parallel, so as to increase the output current. Individual solar cells are provided with interconnects and a cover glass so as to form so-called CICs (Cell-Interconnect-Cover Glass) assemblies, which are then electrically interconnected to form an array. Conventionally, these large solar cells have been mounted on a support and interconnected using a substantial amount of manual labor. For example, first individual CICs are produced with each interconnect individually welded to each cell, and each cover glass individually mounted. Then, these CICs are connected in series to form strings, generally in a substantially manual manner, including welding or soldering steps. Then, these strings are mounted and secured to a panel or substrate and further electrically interconnected, in a process that includes the application of adhesive, wiring, and other assembly steps.

Close packing of the large solar cells on the space solar array panel is challenging due to the spatial layout necessary to accommodate discrete metal interconnect elements between the solar cells to form a series circuit of interconnected solar cells and to implement and interconnect the bypass diodes. An additional challenge can sometimes reside in the need to interconnect a plurality of strings of series connected solar cells in parallel. All of this has traditionally been carried out in a manual and substantially labor-intensive manner.

Accordingly, the present disclosure provides improved array designs and methods of manufacturing and assembling photovoltaic solar arrays in an automated manner that can result in decreases in cost, less weight, greater compactness, and increases in performance.

SUMMARY OF THE DISCLOSURE

1. Objects of the Disclosure

It is an object of the present disclosure to provide a solar cell array with a high packing density for unifacial solar cells, i.e. cells with anode and cathode contacts on the same surface of the cell.

It is another object of the present disclosure to provide a solar cell array utilizing solar cell with all backside contacts.

It is still an object of the present disclosure to provide a high packing density solar cell array with integral interconnections between solar cells implemented on the supporting substrate or panel, with the solar cell assembly having all backside contacts.

It is an object of the present disclosure to provide an improved solar cell assembly or CIC with a cover glass on the top surface and both anode and cathode electrode contacts on the back surface of the solar cell assembly.

It is also another object of the present disclosure to provide an automated method for assembling a solar cell array from a CIC in which the solar cell assembly has all backside contacts.

It is also another object of the present disclosure to provide an automated method for assembling a solar cell assembly or CIC with a stand-off component disposed in one or more cropped corners of the solar cell.

It is another object of the present disclosure to provide a lightweight solar cell assembly with unifacial back contacts that is suitable for automated manufacturing processes.

It is another object of the present disclosure to provide a lightweight discrete conductive semiconductor element suitable for automated processes for use in electrical coupling of subcomponents in a photovoltaic solar cell or array.

It is another object of the disclosure to provide a solar cell array platform or support with high W/kg and W/m$^2$ and low cost by utilizing discrete conductive traces on the support and lightweight semiconductor conductive elements to make electrical contact with different surface portions of the solar cell.

It is another object of the disclosure to provide a solar cell assembly or module that utilizes an array of wafer-sized solar cells, for example, solar cells each having a surface area of greater than 50 cm$^2$, and are substantially square in shape, in which the four corners are cropped and accommodate electrical interconnect elements.

Some implementations or embodiments may achieve fewer than all of the foregoing objects.

2. Features of the Disclosure

All ranges of numerical parameters set forth in this disclosure are to be understood to encompass any and all subranges or "intermediate generalizations" subsumed herein. For example, a stated range of "1.0 to 2.0 eV" for a band gap value should be considered to include any and all subranges beginning with a minimum value of 1.0 eV or more and ending with a maximum value of 2.0 eV or less, e.g., 1.0 to 2.0, or 1.3 to 1.4, or 1.5 to 1.9 eV.

Briefly, and in general terms, the present disclosure provides a solar cell assembly comprising:

(a) a multijunction semiconductor solar cell including:
a top or light receiving surface;
a first edge;
a second edge parallel to and opposite the first edge;
a third edge orthogonal to the first edge, and a fourth edge parallel to and opposite the third edge and orthogonal to the first edge;
a fifth edge adjacent to the first edge and having a length shorter than the first edge;
a sixth edge adjacent to the fifth edge and the third edge and having a length shorter than the fifth edge;
a seventh edge adjacent to the second edge and having a length shorter than the second edge;
an eighth edge adjacent to the seventh edge and the third edge and having a length shorter than the seventh edge;
a ninth edge adjacent to the second edge and having a length shorter than the second edge;
a tenth edge adjacent to the ninth edge and the fourth edge and having a length shorter than the ninth edge;
an eleventh edge adjacent to the first edge and having a length shorter than the first edge;
a twelfth edge adjacent to the eleventh edge and the fourth edge and having a length shorter than the eleventh edge; and
a bottom or back surface, opposite to the top surface, including an electrical contact of a first polarity type;

(b) a first stand-off component having a first edge that is collinear with the fifth edge of the solar cell, a second edge that is collinear with the third edge of the solar cell, and a third edge that is parallel to and spaced apart from the sixth edge of the solar cell;

(c) a second stand-off component having a first edge that is collinear with the ninth edge of the solar cell, a second edge that is collinear with the fourth edge of the solar cell, and a third edge that is parallel to and spaced apart from the tenth edge of the solar cell; and (d) a coverglass disposed over the solar cell and the first and second stand-off components and attached thereto by an adhesive.

In some embodiments, there further comprises a third stand-off component having a first edge that is collinear with the eleventh edge of the solar cell, a second edge that is collinear with the fourth edge of the solar cell, and a third edge that is parallel to and spaced apart from the twelfth edge of the solar cell.

In some embodiments, there further comprises a bypass diode having a first edge that is collinear with the seventh edge of the solar cell, a second edge that is collinear with the third edge of the solar cell, and a third edge that is parallel to and spaced apart from the eighth edge of the solar cell, the bypass diode being electrically connected in parallel with the solar cell.

In some embodiments, there further comprises a plurality of grid lines extending over the top surface of the solar cell; a first bus bar conductively connected to a first set of said grid lines and having a first portion extending substantially parallel to and proximate to the third edge of the solar cell, and a second portion extending substantially parallel to and proximate to the sixth edge of the solar cell; and an electrical interconnect coupling the second portion of the first bus bar with the top surface of the first stand-off component.

In some embodiments, there further comprises a second bus bar conductively connected to a second set of said grid lines and having a first portion extending substantially parallel to and proximate to the fourth edge of the solar cell, and a second portion extending substantially parallel to and proximate to the tenth edge of the solar cell; and an electrical interconnect coupling the second portion of the second bus bar with the top surface of the second stand-off component.

In some embodiments, the first and second stand-off components are each shaped as a triangular prism and each extends from the top surface of the solar cell to the bottom surface of the solar cell and forms a first and second respective electrical contacts of a second polarity type on the bottom of the assembly.

In some embodiments, the stand-off components are composed of a highly doped semiconductor material.

In some embodiments, the stand-off components are composed of gallium arsenide.

In some embodiments, the grid lines are arranged parallel to one another and substantially orthogonal to the first and second bus bars.

In some embodiments, there is no bus bar along the first and second edges of the solar cell.

In some embodiments, the stand-off component is a discrete semiconductor element shaped as a triangular prism having a side length from 2 to 25 mm and a height from 120 to 150 microns.

In some embodiments, the stand-off components are disposed in opposite corners of the solar cell.

In some embodiments, there further comprises a bypass diode disposed adjacent to one of the corners of the solar cell.

In some embodiments, the bypass diode is triangular in shape having a first external edge that is collinear with one of the four long edges of the solar cell and a second external edge that is collinear with the edge of one of the cropped corners of the cell.

In some embodiments, the discrete semiconductor element has first and second end surfaces which are metallized with a metal to a thickness of approximately 5 microns to form a contact or bonding pad.

In some embodiments, the first, second, third and fourth edges are all of equal length, and the fifth, sixth, and ninth edges are all of equal length and smaller than that of the first edge.

In some embodiments, the eighth edge is a different length than the fifth edge, but smaller than the first edge.

In some embodiments, the first set of grid lines are electrically separate from the second set of grid lines.

In another aspect, the present disclosure provides a back contact solar cell assembly comprising:

(a) a multijunction semiconductor solar cell including: a top or light receiving surface; a plurality of grid lines extending over the top surface of the solar cell; a bottom or back surface, opposite to the top surface, including an electrical contact of a first polarity; a first bus bar conductively connected to a first set of said grid lines and having a first portion extending substantially parallel to and proximate a first edge of the solar cell, and a second portion extending substantially parallel to and proximate to a second edge of the solar cell adjacent to the first edge; a second bus bar spaced apart and distinct from the first bus bar and conductively connected to a second set of grid lines and having a first portion extending substantially parallel to and proximate to a third edge of the solar cell, and a second portion extending substantially parallel to and proximate a fourth edge of the solar cell adjacent to the third edge; wherein the third and fourth edges are disposed on the opposite side of the solar cell from the first and second edges;

(b) a first discrete conductive stand-off component spaced apart from the solar cell and proximate to the first bus bar and electrically coupled thereto, the first stand-off component extending from the top surface of the solar cell to the bottom surface of the solar cell to form a first electrical contact of a second polarity type on the bottom of the assembly;

(c) a second discrete conductive stand-off component spaced apart from the solar cell and proximate to the second bus bas and electrically coupled thereto, the second stand-off component extending from the top surface of the solar cell to the bottom surface of the solar cell to form a second electrical contact of a second polarity type on the bottom of the assembly; and (d) a coverglass disposed over the solar cell and the first and second stand-off components and attached thereto by an adhesive.

In another aspect, the present disclosure provides a solar cell array comprising: a substrate; a plurality of conductive traces including a first conductive trace and a second conductive trace, each of the conductive traces being supported by the substrate; a plurality of solar cells including a first solar cell and a second solar cell, each solar cell comprising a top surface with a top contact of a first polarity and a back surface with a first back contact electrically coupled to the top contact by at least a first discrete semiconductor interconnect element, and a second back contact coupled to the back surface of the solar cell forming a contact of a second polarity; wherein the first solar cell is arranged on the substrate with its first back contact bonded to a first end portion of the conductive trace, and wherein the second solar cell is arranged on the substrate with its second back contact bonded to a second end portion of the first conductive trace.

In another aspect, the present disclosure provides a solar cell assembly comprising: a support comprising a first side and an opposing second side; a conductive layer comprising first and second spaced-apart conductive portions disposed on the first side of the support; a plurality of solar cell assemblies mounted on the first side of the support, each solar cell of the plurality of solar cell assembly comprising a top surface including a contact of a first polarity type, and a rear surface including a contact of a second polarity type; a conductive element in the solar cell assembly extending from the top surface of the assembly to the rear surface of the assembly, each respective conductive element making electrical contact with the contact of the first polarity type of a respective solar cell and extending along a cut out in the side of the solar cell to make electrical contact with the first conductive portion disposed on the first side of the support, and the contact of second polarity of the solar cell making electrical contact with the second conductive portion of the conductive layer.

In another aspect, the present disclosure provides a solar cell with grid lines disposed along the top surface thereof, a first bus bar connected to a first end portion of the grid lines, a second bus bar connected to a second end portion of the grid lines opposite to the first end portion, a first discrete semiconductor element connected to the first bus bar, and a second discrete semiconductor element connected to the second bus bar.

In some embodiments, the conductive traces are metal traces having a thickness in the range of from 1 µm and up to 50 µm, the substrate comprises a polyimide film, and the solar cells are III-V compound semiconductor solar cells having cropped corners.

In another aspect, the present disclosure provides a method of producing a solar cell assembly, including providing a flexible substrate; providing a plurality of conductive traces on the substrate, the plurality of conductive traces including a first conductive trace and a second conductive trace, each of the conductive traces being at least partly adhered to the substrate, each of the conductive traces comprising a first end portion and a second end portion; providing a plurality of solar cells including a first solar cell and a second solar cell, each solar cell comprising a top surface with a top contact of a first polarity and a back surface with a back contact of a second polarity; and bonding the back contact of the first solar cell to the first end portion of the first conductive trace, bonding the back contact of the second solar cell to the first end portion of the second conductive trace, and bonding the second end portion of the first conductive trace to the top contact of the second solar cell for connecting the first solar cell and the second solar cell in electrical series.

According to an aspect of the present disclosure, there is provided a method of fabricating a solar cell array by assembling a solar cell assembly to a support. The method includes disposing discrete spaced apart metallized traces on the upper surface of the support; dispensing a conductive adhesive on the support or on the discrete contacts on the back of the solar cell assembly or on the traces on the support; and laying down the solar cell assembly on the support so that the bonding pads of opposite polarity on the back of the solar cell assembly are electrically coupled to respective trace lines on the support. The support may be a flexible polyimide film or a rigid panel.

One aspect of the disclosure relates to a method of producing a solar cell assembly, comprising:

providing a flexible substrate;

providing a plurality of conductive traces on the substrate, the plurality of conductive traces including a first conductive trace and a second conductive trace, each of the conductive traces being at least partly adhered to the substrate, each of the conductive traces comprising a first end portion and a second end portion;

providing a solar cell comprising a top surface with a top contact of a first polarity and a back surface with a back contact of a second polarity;

bonding the back contact of the first solar cell to the first end portion of the first conductive trace;

bonding the back contact of the second solar cell to the first end portion of the second conductive trace; and bonding the second end portion of the first conductive trace to the top contact of the second solar cell for connecting the first solar cell and the second solar cell in electrical series.

In the present context, the term "trace" refers to a conductive layer on the substrate, preferably a thin conductive layer, for example, a conductive layer having a thickness in the range of from 1 µm and up to 50 µm. The traces can be of a conductive material, such as of metal, for example, copper, gold, silver, nickel, or other materials and conductive alloys thereof.

Although reference has been made to a first solar cell and a second solar cell in series, more generally, any number of solar cells may be connected in series, for example, N solar cells on a panel can all be connected in series by bonding the second end portion of the corresponding (N−1) conductive traces to the top contact of the subsequent or preceding solar cell.

In another aspect, the bonding between the solar cell contacts and the first and second end portions of the traces can take place by any suitable means, including welding (such as laser welding), by using a conductive adhesive, soldering, or ultrasonic bonding.

A flexible and insulating substrate thus supports a plurality of separate conductive traces. In some embodiments, the conductive layer is a metal layer such as a copper layer, having a thickness in the range of from 1 µm and up to 50 µm. In some embodiments, the step of providing the conductive layer on the substrate comprises attaching the conductive layer to the substrate in an adhesive-less manner, to limit outgassing when the assembly is used in a space environment. Any method suitable for selectively removing part of the conductive layer can be used to establish the traces as defined above.

The back and/or top contacts of the solar cells can in some embodiments be bonded to the respective portions of the conductive traces using a bonding agent such as conductive bonding material, for example, a metal alloy, such as an indium alloy, such as an indium lead alloy. Indium lead has appropriate heat conduction characteristics and at the same time, indium is advantageous as it provides for ductility, thereby reducing the risk for cracks in the bonds between the solar cells and the conductive traces when the assembly is subjected to bending forces.

Another aspect of the disclosure relates to a solar cell assembly, comprising:

a plurality of solar cells including a first solar cell and a second solar cell, each solar cell comprising a top surface with a top contact of a first polarity and a back surface with a back contact of a second polarity;

a flexible substrate;

a plurality of conductive traces including a first conductive trace and a second conductive trace, each of the conductive traces being at least partly adhered to the flexible substrate;

wherein the first solar cell is arranged on the substrate with its back contact bonded to a first end portion of the first conductive trace, and wherein the second solar cell is arranged on the substrate with its back contact bonded to a first end portion of the second conductive trace;

wherein the first conductive trace comprises a second end portion bonded to the top contact of the second solar cell for connecting the first solar cell and the second solar cell in electrical series.

In some embodiments, the solar cells are III-V compound semiconductor solar cells.

In some embodiments, the method further comprises welding the back surfaces of the second end portions to the top contacts of the respective solar cells.

Additional aspects, advantages, and novel features of the present invention will become apparent to those skilled in the art from this disclosure, including the following detailed description as well as by practice of the invention. While the invention is described below with reference to illustrative embodiments, it should be understood that the invention is not limited thereto. Those of ordinary skill in the art having access to the teachings herein will recognize additional applications, modifications and embodiments in other fields, which are within the scope of the invention as disclosed and claimed herein and with respect to which the invention could be of utility.

"Top surface" is used herein to refer to a surface that would face towards incoming solar radiation in normal operation of the flexible solar array, but need not refer to a surface that is directly exposed to the solar radiation, such as a top surface of a backing layer. "Back surface" is used to refer to a surface that would face away from incoming solar radiation in normal operation. "Upwards" is used herein to indicate a direction relative to these top and bottom surfaces. A surface abutting another surface need not abut across the entirety of both surfaces.

BRIEF DESCRIPTION OF THE DRAWINGS

To complete the description and in order to provide for a better understanding of the disclosure, a set of drawings is provided. Said drawings form an integral part of the description and illustrate embodiments of the disclosure, which should not be interpreted as restricting the scope of the disclosure, but just as examples of how the disclosure can be carried out. The drawings comprise the following figures.

DETAILED DESCRIPTION

Figure 1:
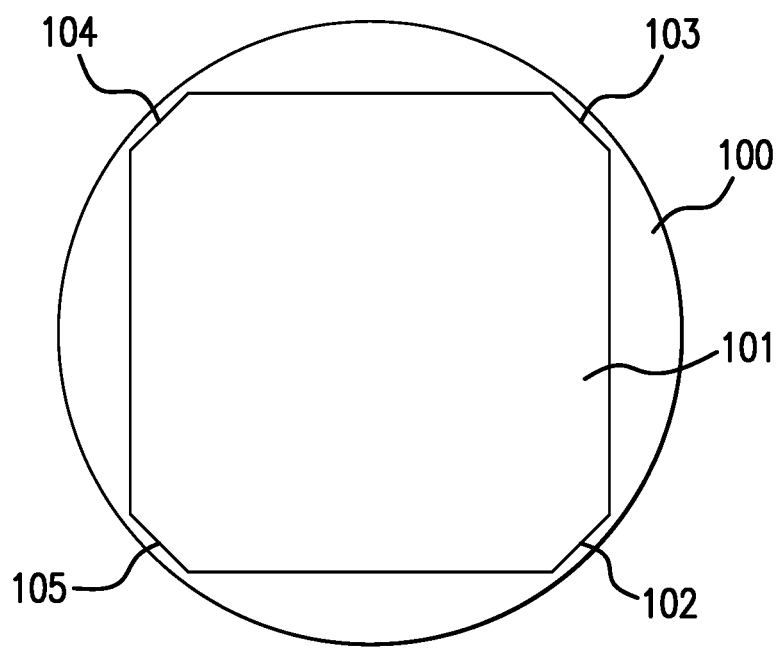
FIG. 1 is a top plan view of a semiconductor wafer with a solar cell with cropped corners disposed therein, with edge lines depicting how the solar cell would be scribed or cut from the semiconductor wafer.

Details of the present disclosure will now be described including exemplary aspects and embodiments thereof.

Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

It is known in the art to arrange a solar cell array on a panel by connecting the solar cells in a series circuit by connecting the top contact (of a first polarity or conductivity type) of one solar cell to the back contact (of a second polarity or conductivity type) of the preceding or following adjacent solar cell. This connection can for example be carried out by bonding a conductive element (or "interconnect") to the top contact of a first solar cell and to the back contact of the other solar cell, or to a conductive trace to which the back contact is connected. US-2010/0282288-A1 shows one example of this kind of arrangement. However, this involves the use of additional conductive elements, such as for example conductive wires, and often the use of additional bonds between components.

By using a discrete conductive semiconductor element (in one embodiment) according to the present disclosure bonded to the top contact of one solar cell and bonding this element to an adjacent solar cell in the series of solar cells there is no need for additional components to establish the connection in series of the solar cells, and the number of bonding points can be minimized. This can be advantageous from the point of view of, for example, ease of manufacture, weight of the assembly, cost and/or reliability.

For CIC building a one-cell-per-wafer cell provides significant cost benefit compared to the two-cells-per-wafer solution by reducing the piece part count by half. But this benefit comes with a cost—The cell performance can reduce by 2% relative on efficiency due to the increased series resistance as the grid fingers are twice as long and only one bus bar is practically applicable for the one-cell-per-wafer cell configuration when current stringing technique is applied.

For this invention an all-bottom contact CIC is created by integrating two or more pieces of electrically conductive standoffs into the CIC. The top contact of the cell, along with the top contact of the bypass diode, can be electrically connected to the top side of the standoff by means of interconnect welding, ribbon bonding or other methods. Same as the cell and bypass diode the standoffs are also structurally attached to the coverglass by optically transparent adhesives. By having two or more standoffs, the current collecting is now from both sides of the cell which can significantly reduce the $I^2R$ loss from the series resistance with the help of a two bus bar cell configuration. By electrically connecting all the bottom contacts of the standoffs by means such as flexible circuits, the efficiency of the one-sell-per-wafer cell can be recovered to the same level of a two-sells-per-wafer cell.

In addition to that, an approximately 0.2% extra current generation, for the case of a 65 cm² one-cell-per-wafer cell, may be achieved by replacing the 1.4×2.8 mm welding pads with 0.25×0.5 mm bonding pads, with two bonding pads in each opposite cropped corner. Although the Figures depict two bonding pads for each cropped corner for increased reliability, in some embodiments only one bonding pad may be used in each corner, although the interconnect may make electrical contact to the single bonding pad with two discrete connectors and bonding locations on the bonding pad.

FIG. 1 is a top plan view of a semiconductor wafer 100 with a solar cell 101 with cropped corners 102, 103, 104, and 105 disposed therein, with edge lines depicting how the solar cell 100 would be scribed or cut from the semiconductor wafer 100.

Figure 2A:
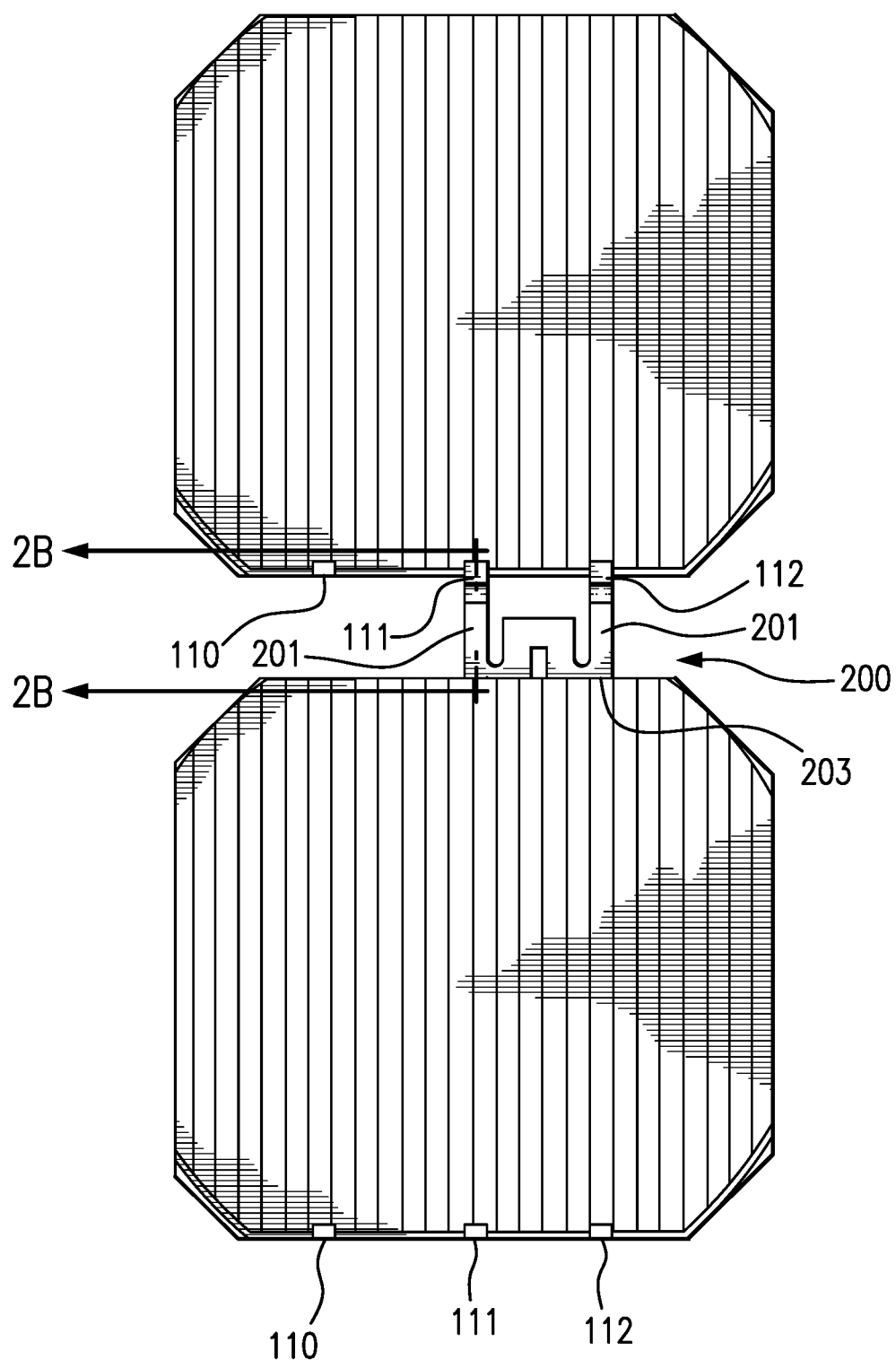
FIG. 2A is a top schematic view of a portion of a solar cell array showing the interconnection of two adjacent solar cells according to the prior art.

FIG. 2A is a top schematic view of a portion of a solar cell array showing the interconnection of two adjacent solar cells 100 and 106 according to the prior art. Each solar cell has contact pads 110, 111 and 112 along one edge thereof. The interconnect 200 has two arms connected to contact pads 111 and 112 respectively of solar cell 106, and is positioned in the space 210 between the solar cells.

Figure 2B:
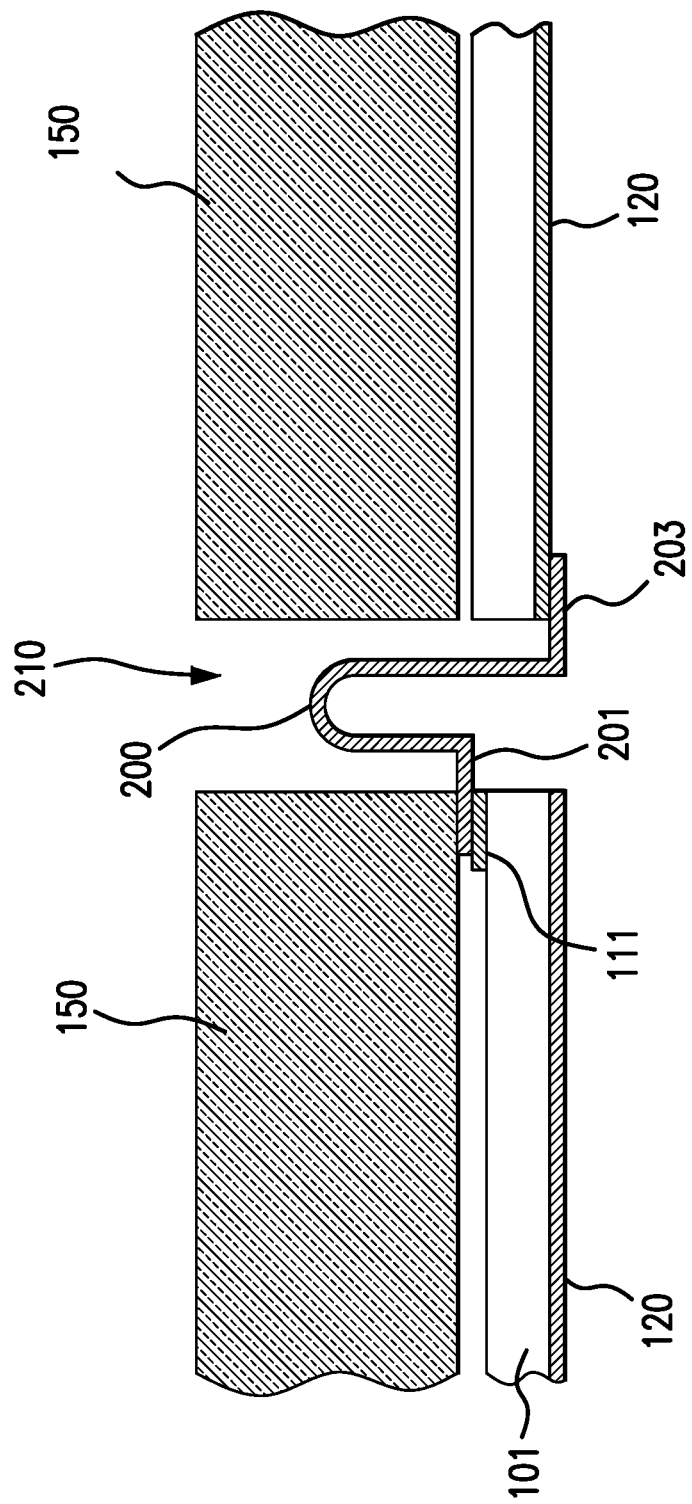
FIG. 2B is a cross sectional view of the solar cell array through the 2B-2B plane shown in FIG. 2A.

FIG. 2B is a cross sectional view of a portion of the solar cell array through the 2B-2B plane shown in FIG. 2A. The interconnect 200 has one arm 201 connected to the top contact pad 111 of solar cell 101, and a portion 203 connected to the back contact 121 of solar cell 106. A cover glass 150 is disposed over solar cell 101 and a cover glass 151 is disposed over solar cell 106.

Figure 3A:
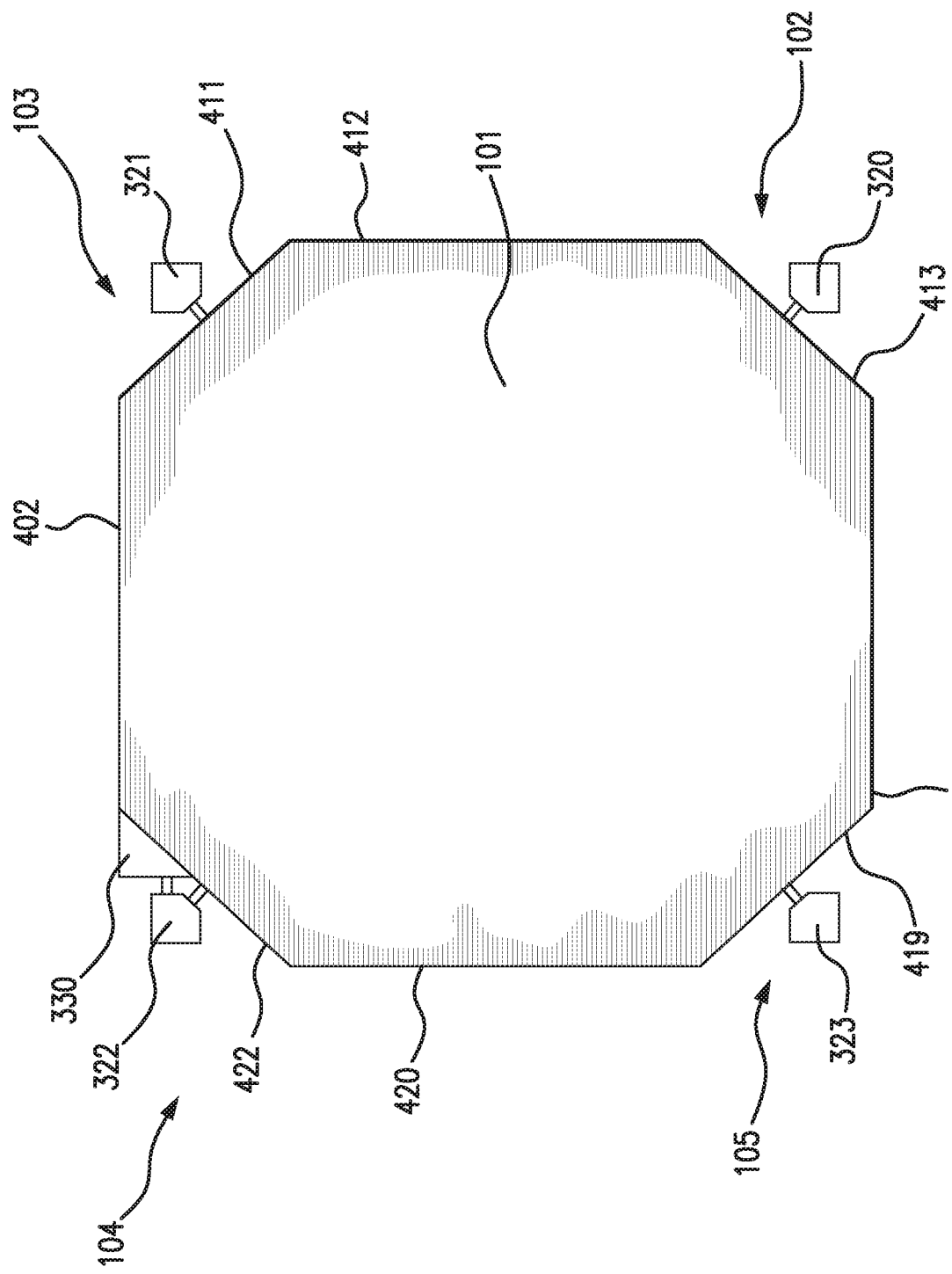
FIG. 3A is a highly simplified top plan view of a portion of a solar cell assembly depicting a plurality of stand-off elements adjacent to the solar cell in a first embodiment.

FIG. 3A is a highly simplified top plan view of a portion of a solar cell assembly depicting a plurality of stand-off elements adjacent to the solar cell in a first embodiment.

In the first cropped corner 102 is a first stand-off element 320, in the second cropped corner 103 is a second stand-off element 321, in the third cropped corner 104 is a third stand-off element 322, and in the fourth cropped corner 105 is a fourth stand-off element 323. Moreover, in the third cropped corner is a bypass diode 330.

Figure 3B:
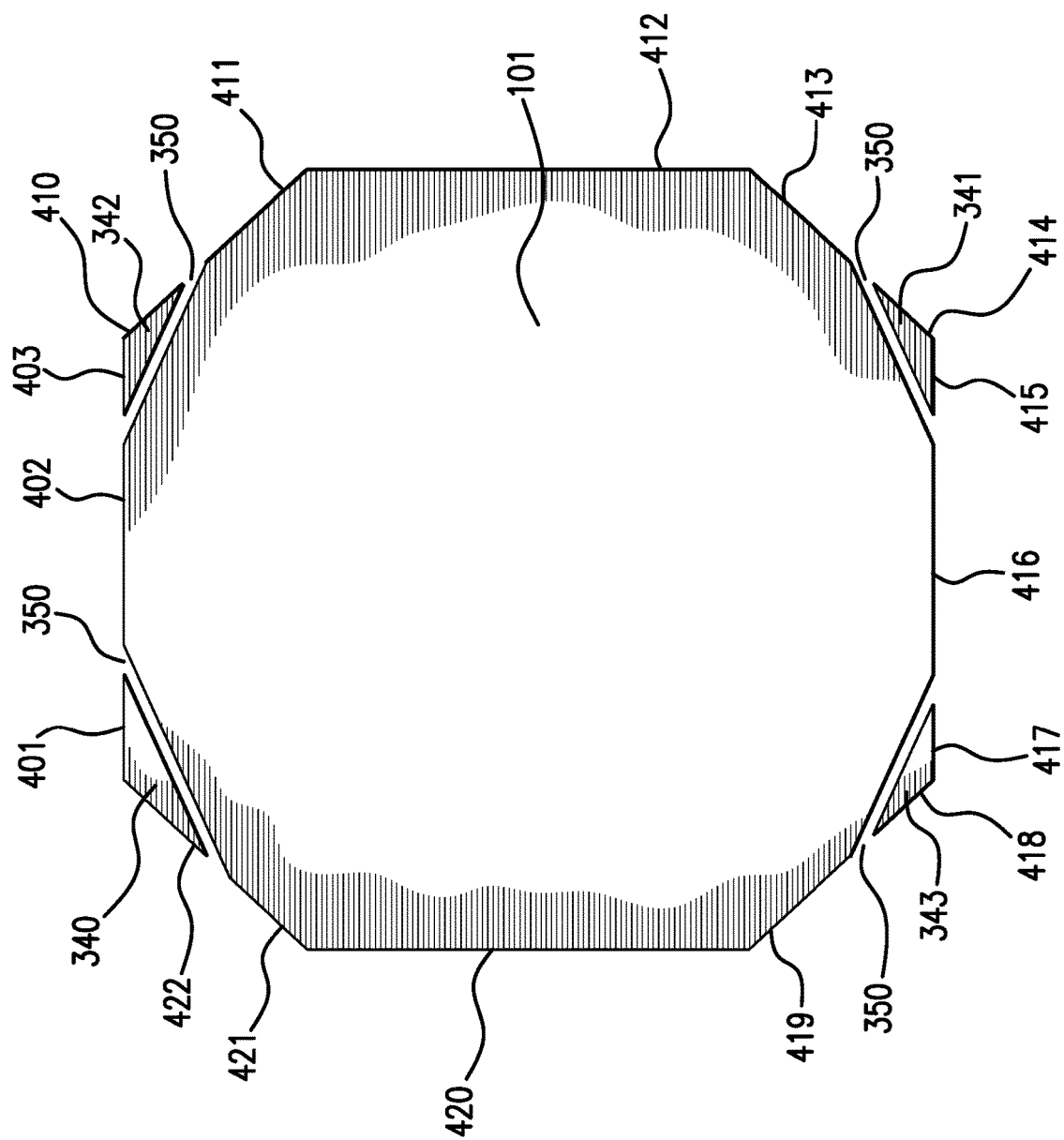
FIG. 3B is a highly simplified top plan view of a portion of a solar cell assembly depicting a plurality of stand-off elements adjacent to the solar cell in a second embodiment.

FIG. 3B is a highly simplified bottom plan view of a portion of a solar cell assembly depicting a plurality of stand-off elements adjacent to the solar cell in a second embodiment.

In particular, the figure depicts a multijunction semiconductor solar cell including: a first edge 402; a second edge 416 parallel to and opposite the first edge; a third edge 420 orthogonal to the first edge, and a fourth edge 412 parallel to and opposite the third edge and orthogonal to the first edge; a fifth edge 422 adjacent to the first edge and having a length shorter than the first edge; a sixth edge 421 adjacent to the fifth edge 422 and the third edge and having a length shorter than the fifth edge 422; a seventh edge 417 adjacent to the second edge and having a length shorter than the second edge 416; an eighth edge 419 adjacent to the seventh edge 417 and the third edge and having a length equal to or shorter than the seventh edge 417; a ninth edge 415 adjacent to the second edge 416 and having a length shorter than the second edge 416; a tenth edge 413 adjacent to the ninth edge 415 and the fourth edge 412 and having a length equal to or shorter than the ninth edge 415; an eleventh edge 410 adjacent to the first edge 402 and having a length shorter than the first edge 402; a twelfth edge 411 adjacent to the eleventh edge 410 and the fourth edge and having a length equal to or shorter than the eleventh edge 410.

The Figure further depicts: (a) a first stand-off component 343 having a first edge 433 that is collinear with the second edge 416 of the solar cell, a second edge 418 that is collinear with the eighth edge 419 of the solar cell, and a third edge 432 that is parallel to and spaced apart from the seventh edge of the solar cell; (b) a second stand-off component 342 having a first edge 403 that is collinear with the first edge 402 of the solar cell, a second edge 404 that is collinear with the twelfth edge of the solar cell, and a third edge 405 that is parallel to and spaced apart from the eleventh edge of the solar cell; and (c) a third stand-off component 341 having a first edge 423 that is collinear with the second edge 416 of the solar cell, a second edge 414 that is collinear with the tenth edge of the solar cell, and a third edge 424 that is parallel to and spaced apart from the ninth edge of the solar cell. (d) a coverglass disposed over the solar cell and the first and second stand-off components 343 and 342 and attached thereto by an adhesive.

The solar cell assembly in FIG. 3B further depicts a bypass diode 340 having a first edge 401 that is collinear with the first edge of the solar cell, a second edge 430 that is collinear with the sixth edge of the solar cell, and a third edge 431 that is parallel to and spaced apart from the fifth edge of the solar cell, the bypass diode being electrically connected in parallel with the solar cell.

Figure 3C:
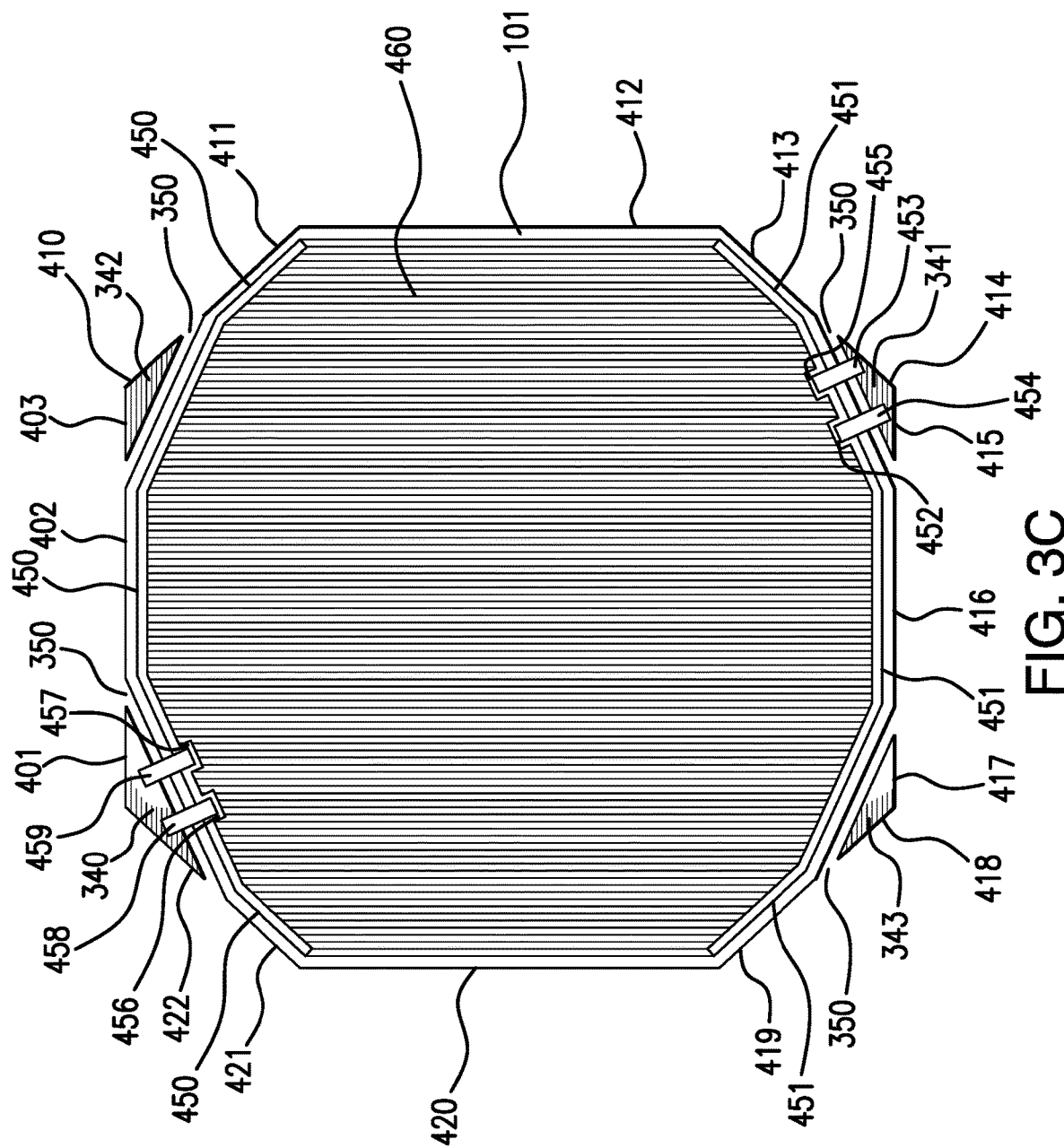
FIG. 3C is a top plan view of a portion of a solar cell of FIG. 3B depicting the grid lines, bus bars, and contact pads according to the present disclosure.

FIG. 3C is a top plan view of a portion of a solar cell of FIG. 3B depicting the grid lines, bus bars, and contact pads according to the present disclosure.

In particular, there is illustrated a plurality of grid lines 460 extending over the top surface of the solar cell 101; a first bus bar 450 conductively connected to a first set of said grid lines 460 and having a first portion extending substantially parallel to and proximate to the first edge 402 of the solar cell, and a second portion extending substantially parallel to and proximate to the fifth edge of the solar cell; and electrical interconnects 458, 459 coupling the second portion of the first bus bar 450 with contact pads 452 and 455 with the top surface of the bypass diode 340.

In some embodiments, there further comprises a second bus bar 451 conductively connected to a second set of grid lines (which may or may not be identical with, or electrically connected to the first set of grid lines 460) and having a first portion extending substantially parallel to and proximate to the second edge of the solar cell 101, and a second portion extending substantially parallel to and proximate to the ninth edge of the solar cell; and electrical interconnects 454, 455 coupling the second portion of the second bus bar 451 with contact pads 456 and 457 with the top surface of a first stand-off component 341.

In some embodiments, there is a second stand-off component 342, and in some embodiments a third stand-off component 343, so that one stand-off component is disposed in each cropped corner of the solar cell 101.

In some embodiments, the stand-off components are each shaped as a triangular prism and each extends from the top surface of the solar cell 101 to the bottom surface of the solar cell 101 and forms a first and second respective electrical contacts of a second polarity type on the bottom of the assembly.

In some embodiments, the stand-off components 341, 342, 343 are composed of a highly doped semiconductor material.

In some embodiments, the stand-off components 341, 342, 343 are composed of gallium arsenide.

In some embodiments, the grid lines 460 are arranged parallel to one another and substantially orthogonal to the first and second bus bars 450 and 451 respectively.

In some embodiments, there is no bus bar along the first, third and fourth edges 402, 420 and 412 respectively of the solar cell.

In some embodiments, the stand-off component 341, 342, 343 is a discrete semiconductor element shaped as a triangular prism having a side length from 2 to 25 mm and a height from 120 to 150 microns.

In some embodiments, the stand-off element components 343 and 342 are disposed in opposite corners of the solar cell.

In some embodiments, there further comprises a bypass diode 340 disposed adjacent to one of the corners of the solar cell.

In some embodiments, the bypass diode 340 is triangular in shape having a first external edge 401 that is collinear with one 402 of the four long edges of the solar cell and a second external edge 461 that is collinear with the edge 421 of one of the cropped corners of the solar cell.

Figure 3D:
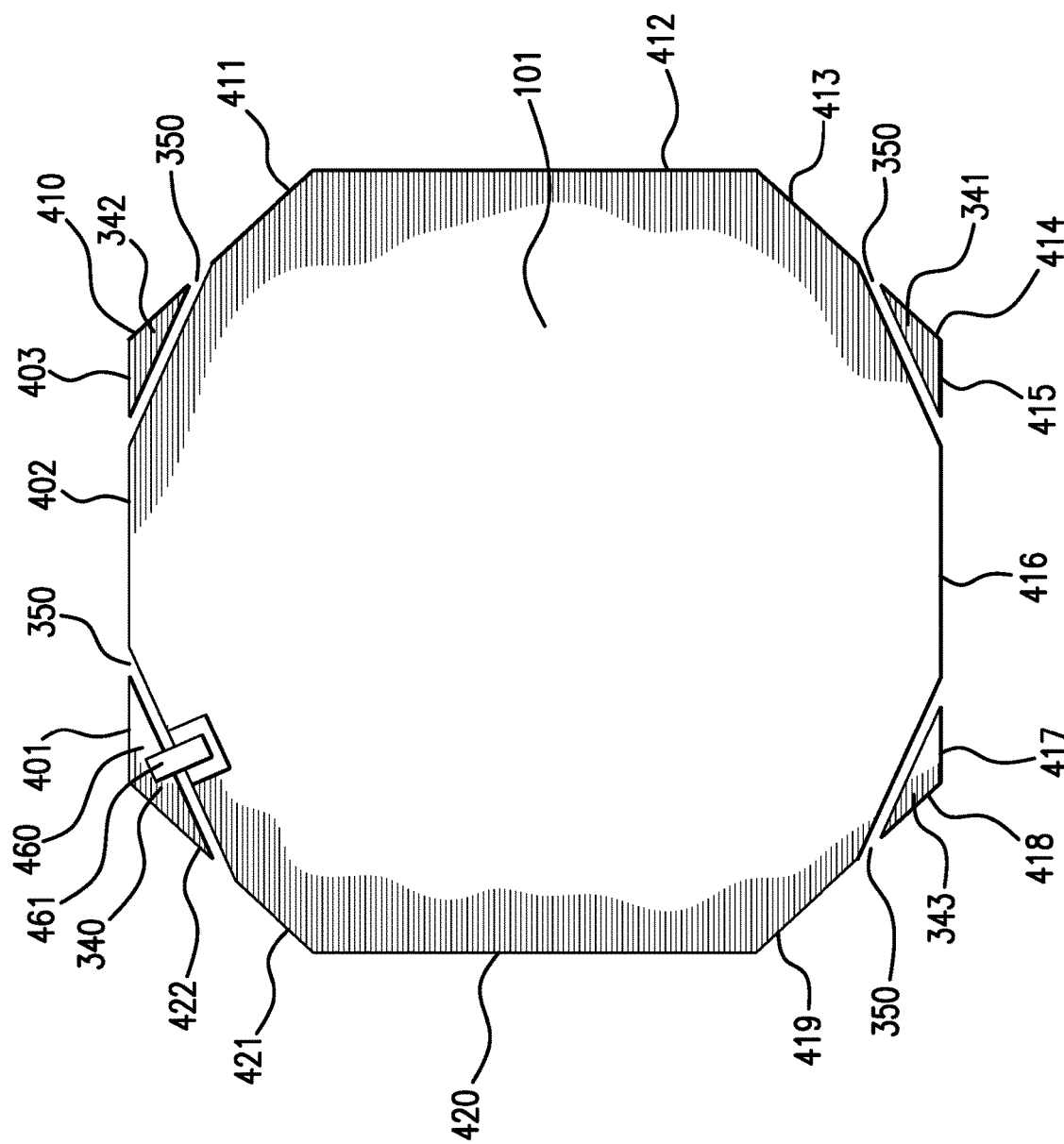
FIG. 3D is a bottom plan view of the solar cell of FIG. 3B with an interconnect to the bypass diode.

FIG. 3D is a bottom plan view of the solar cell of FIG. 3B depicting the interconnect 461 to the bottom surface 460 of the bypass diode 340, which provides an electrical connection to the contact pad 462 on the backside of the solar cell 101. Thus, the bypass diode 340 is electrically in parallel with the subcells of the solar cell 101.

Figure 4A:
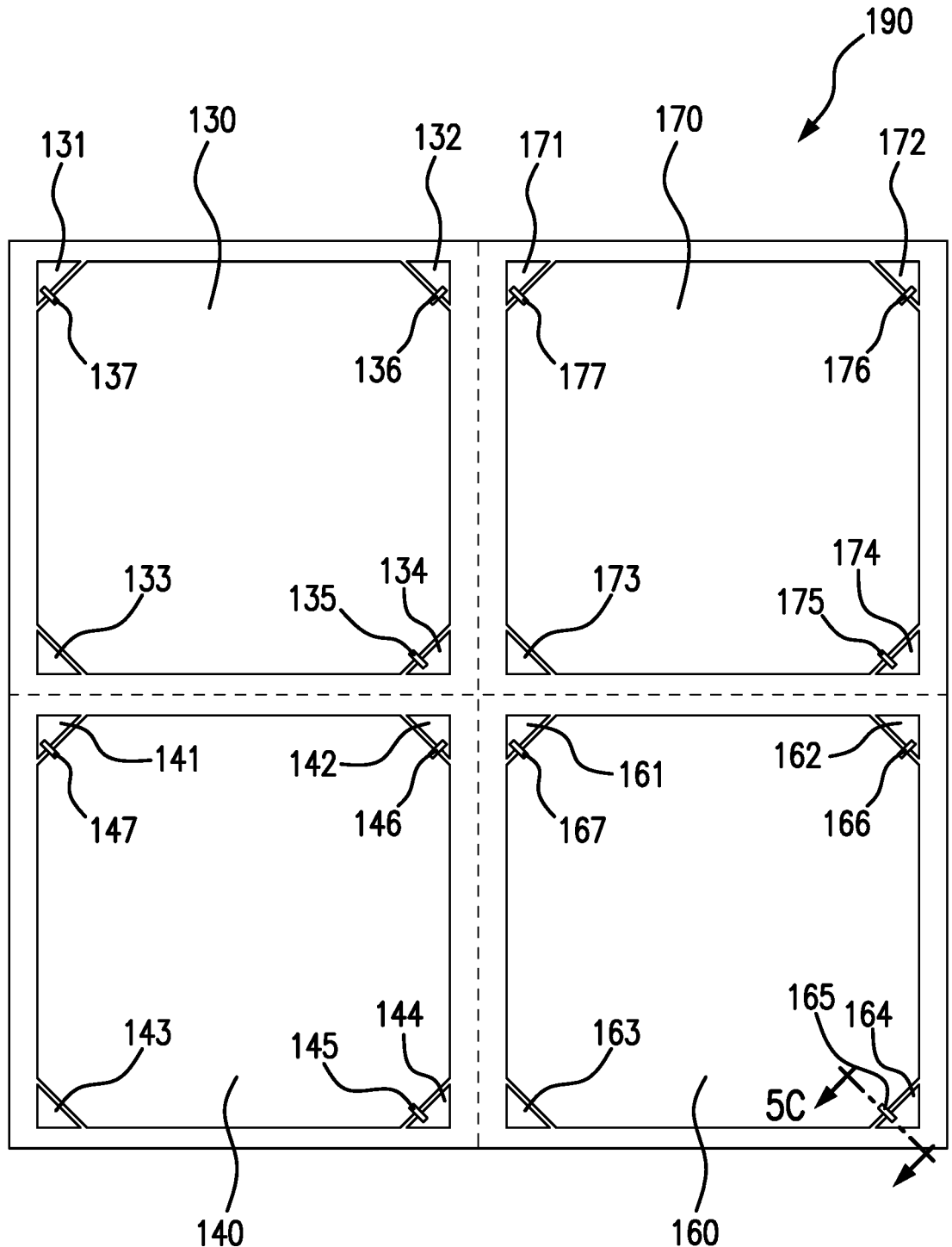
FIG. 4A is a top plan view of a solar cell module with an array of solar cells according to the present disclosure.

FIG. 4A is a top plan view of a solar cell module 190 with an array of four solar cells according to the present disclosure.

The Figure depicts solar cells 130, 140, 160 and 170, bypass diode 131, 141, 161 and 171 disposed in the upper left cropped corner region of the solar cells 130, 140, 160 and 170 respectively. Also depicted are standoff components 132, 133 and 134 disposed in cropped off corners of solar cell 130, standoff components 142, 143, and 144 disposed in cropped off corners of solar cell 140; standoff components 162, 163 and 164 disposed in cropped off corners of solar cell 160; and standoff components 172, 173 and 174 disposed in cropped off corners of solar cell 170.

Also depicted is a first interconnect element 136 making an electrical connection between a first bus bar (not shown) on the top surface of solar cell 130 with the top surface of standoff component 132 and a second interconnect element 135 making an electrical connection between a second bus bar (not shown) on the top surface of solar cell 130 with the top surface of standoff component 134.

Also depicted is a first interconnect element 146 making an electrical connection between a first bus bar (not shown) on the top surface of solar cell 140 with the top surface of standoff component 142 and a second interconnect element 145 making an electrical connection between a second bus bar (not shown) on the top surface of solar cell 140 with the top surface of standoff component 144.

Also depicted is a first interconnect element 166 making an electrical connection between a first bus bar (not shown) on the top surface of solar cell 160 with the top surface of standoff component 162 and a second interconnect element 165 making an electrical connection between a second bus bar (not shown) on the top surface of solar cell 160 with the top surface of standoff component 164.

Also depicted is a first interconnect element 176 making an electrical connection between a first bus bar (not shown) on the top surface of solar cell 170 with the top surface of standoff component 172 and a second interconnect element 175 making an electrical connection between a second bus bar (not shown) on the top surface of solar cell 170 with the top surface of standoff component 174.

Figure 4B:
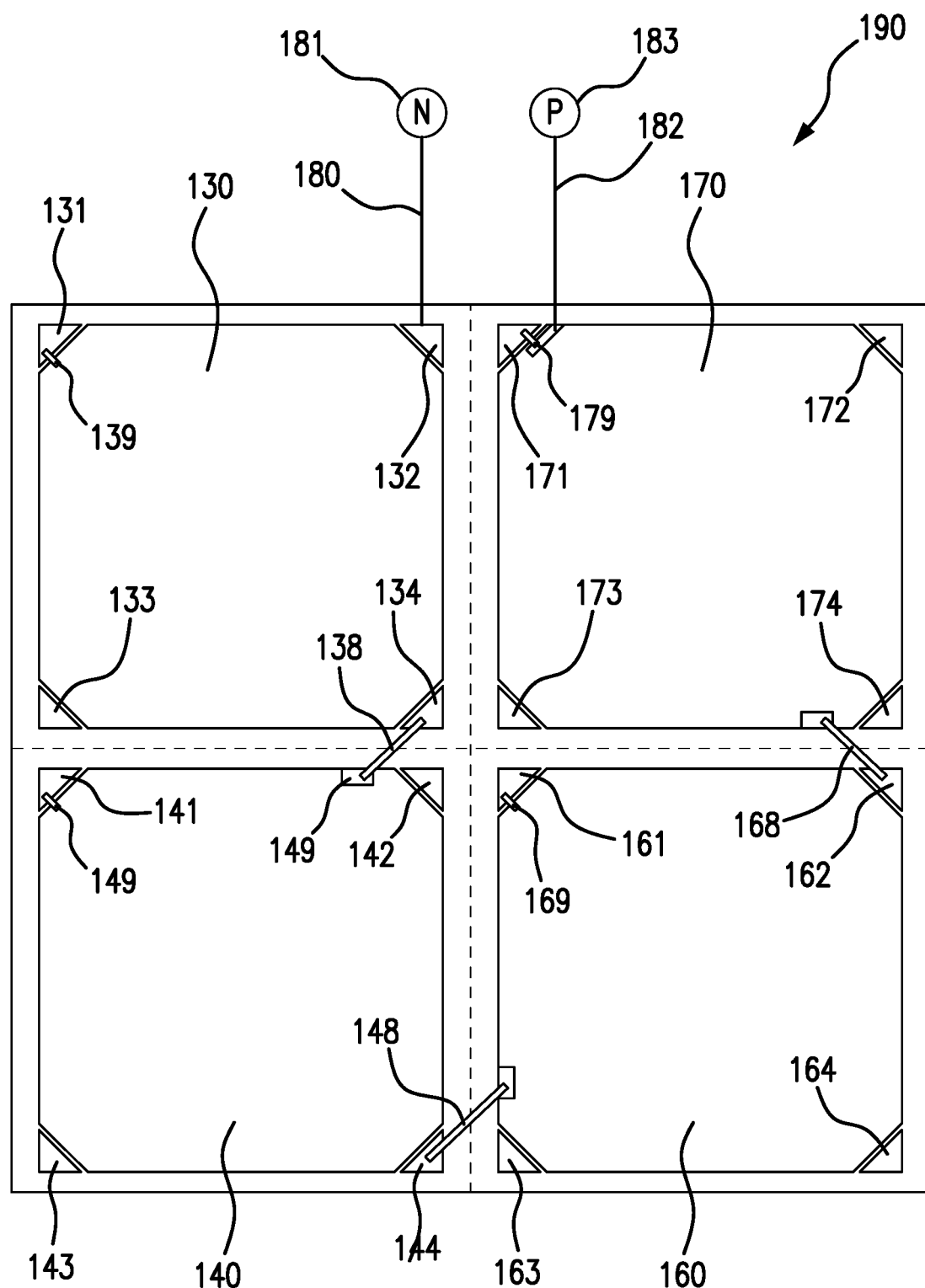
FIG. 4B is a bottom plan view of the module of FIG. 4A.

FIG. 4B is a bottom plan view of the module of FIG. 4A.

In particular, the Figure depicts an interconnect 139, 149, 169 and 179 from the back surface of the bypass diode 131, 141, 161 and 171 respectively to the backside surface pad of the solar cell 130, 140, 160 and 170 respectively. Thus, the bypass diodes 131, 141, 161 and 171 are connected in parallel with the subcells of the solar cells 130, 140, 160 and 170 respectively.

In the embodiment depicted in FIG. 4B, the solar cells 130, 140, 160 and 170 are connected in an electrical series circuit by means of interconnects 138, 148 and 168.

More particularly, interconnect 138 connects the bottom surface of the standoff component 142 with a pad 139 on the back surface of solar cell 130. Since standoff component 142 is connected with the n-terminal of solar cell 140 (see FIG.

4A, and in particular through interconnect 146), a p to n series connection is made between solar cells 130 and 140.

Similarly, interconnect 148 connects the bottom surface of standoff component 163 with a pad 151 on the back surface of solar cell 140. Since standoff component 163 is connected with the n-terminal of solar cell 160 (see FIG. 4A, and in particular through interconnect 152), a p to n series connection is made between solar cells 140 and 160.

Similarly, interconnect 168 connects the bottom surface of standoff component 174 with a pad 153 on the back surface of solar cell 160. Since standoff component 174 is connected with the n-terminal of solar cell 170 (see FIG. 4A, and in particular through interconnect 175), a p to n series connection is made between solar cells 160 and 170.

An n-terminal 181 is connected by a link 180 to stand-off component 132 of solar cell 130, thereby forming one end of the serial connection. A p-terminal 183 is connected by a link 182 to pad 179 on the backside of solar cell 170, thereby forming the other end of the serial connection.

Figure 5A:
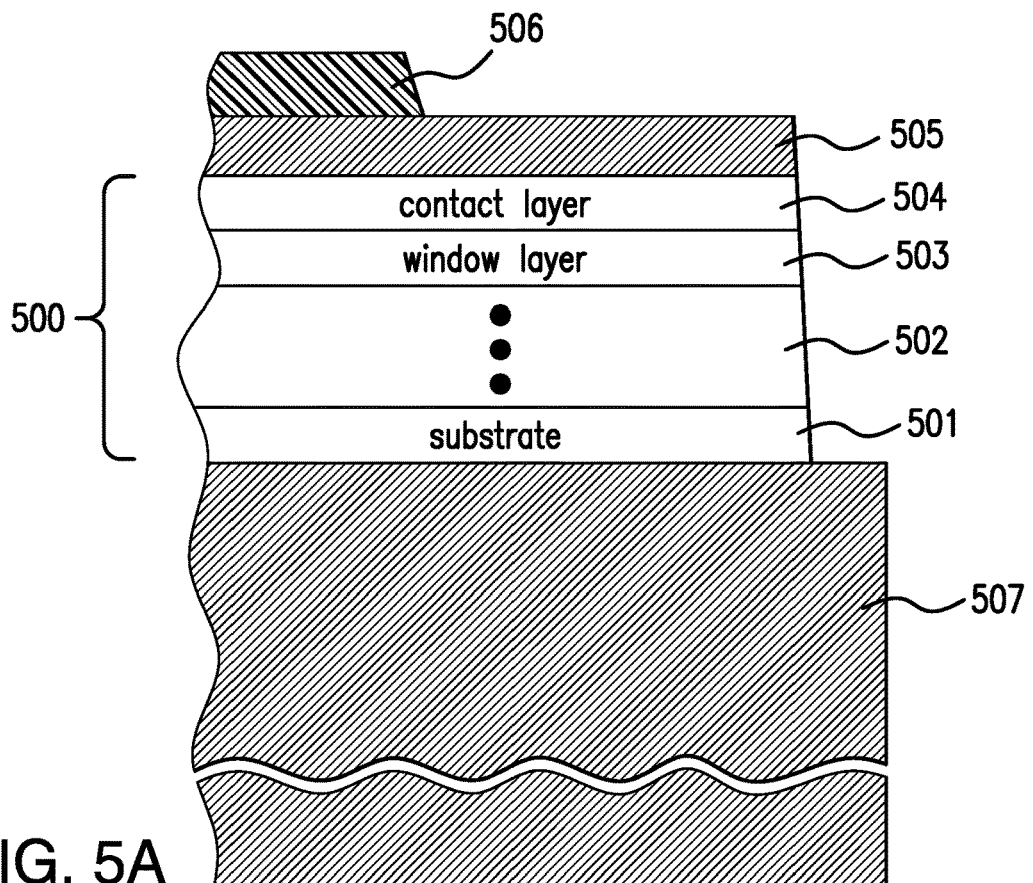
FIG. 5A is a highly simplified cross-sectional view of a portion of a solar cell.

FIG. 5A is a highly simplified cross-sectional view of a portion of a solar cell 500 depicting the top and bottom contacts.

More particularly, the solar cell 500 includes a semiconductor substrate 501, various epitaxial layers 502 deposited over the substrate 501 forming one or more subcells, a window layer 503 disposed over the top subcell, and a semiconductor contact layer 504 disposed over the window layer. A metal layer 505 is disposed over the contact layer 504 to allow an electrical contact to be made to the top side of the solar cell 500. An Antireflective (ARC) dielectric coating layer 506 is then deposited over the top surface of the solar cell 500.

Figure 5B:
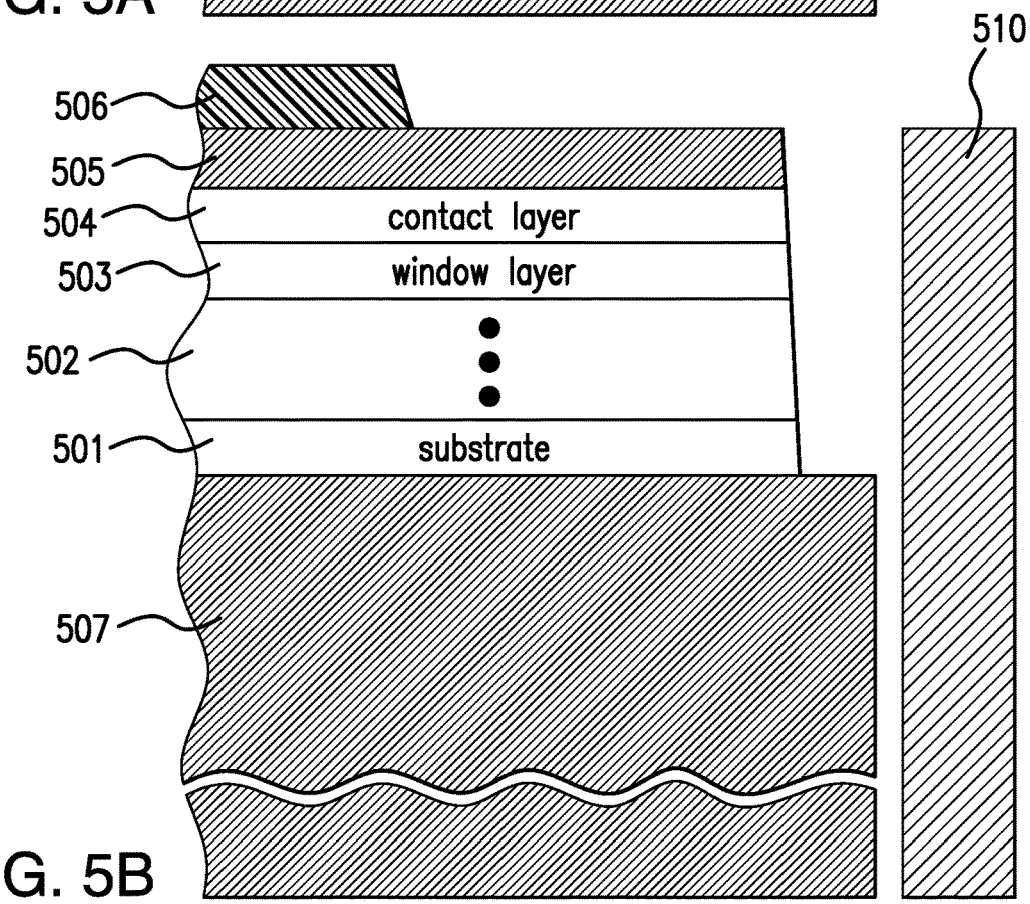
FIG. 5B is a cross-sectional view of the solar cell of FIG. 5A with an adjacent stand-off element.

FIG. 5B is a cross-sectional view of the solar cell of FIG. 5A with an adjacent stand-off element 510 (herein shown in cross-section in one embodiment as composed of metal) disposed adjacent the edge of the solar cell.

Figure 5C:
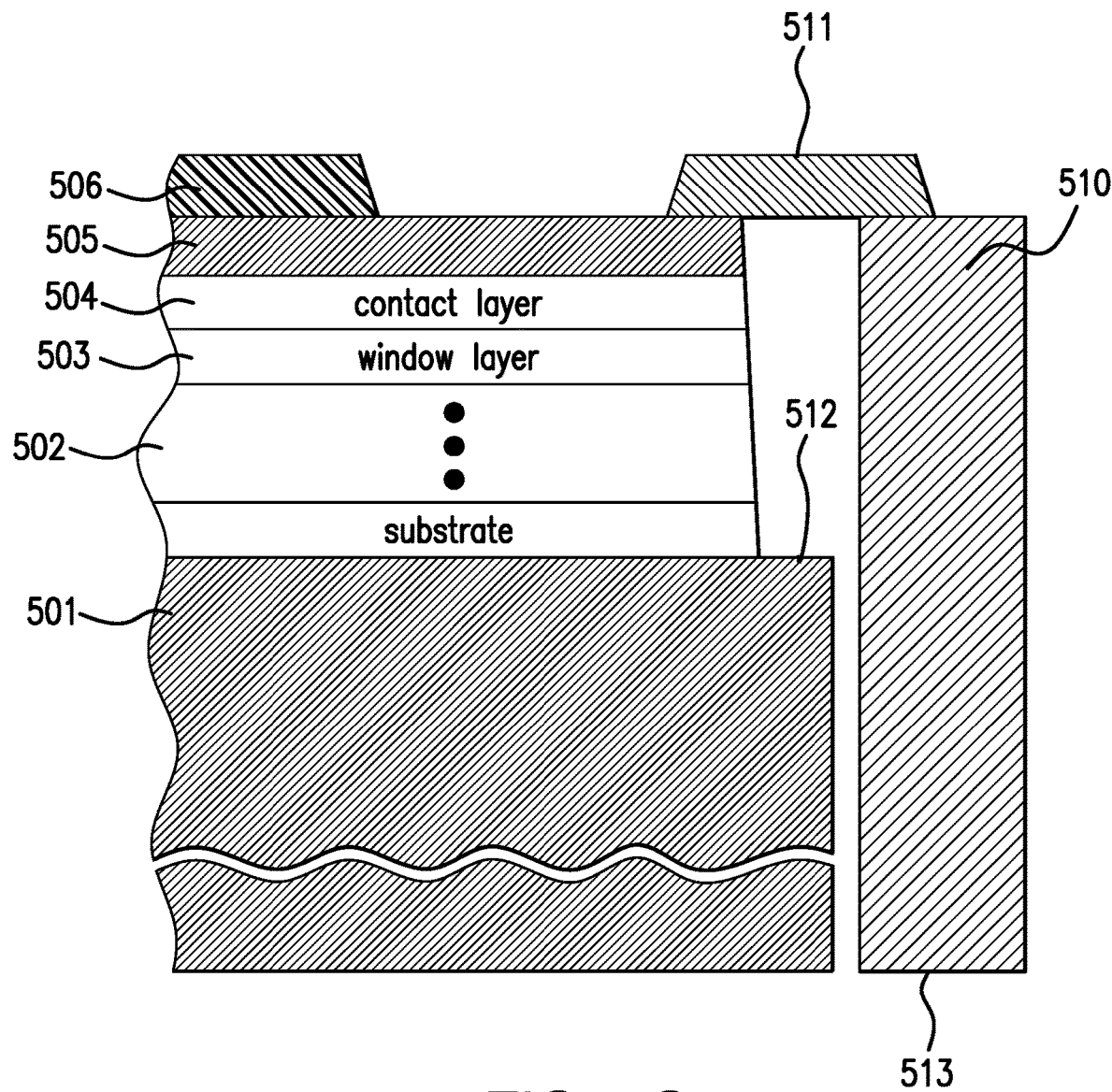
FIG. 5C is a cross-sectional view of the solar cell of FIG. 5A with an interconnect to the stand-off element shown through the 5C-5C plane in FIG. 4A.

FIG. 5C is a cross-sectional view of the solar cell of FIG. 5A with an interconnect element 511 to the stand-off element 510 shown through the 5C-5C plane in FIG. 4A, thereby making a contact surface 513 on the bottom of the stand-off element 510 available on the back side of the solar cell assembly to provide electrical connection to the metal layer 505 on the top side of the solar cell.

Figure 6:
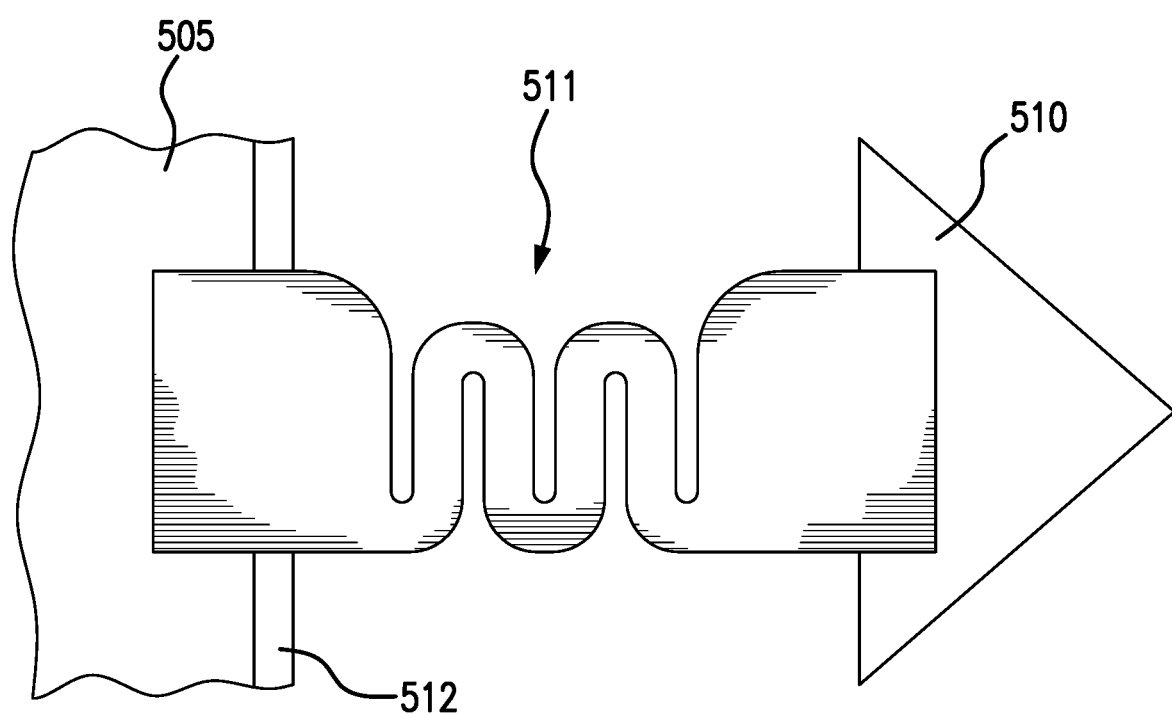
FIG. 6 is a top plan view of the portion of the solar cell and the stand-off element as shown in FIG. 5C with an interconnect element connecting the solar cell and the stand-off element.

FIG. 6 is a top plan view of the portion of the solar cell and the stand-off element 510 as shown in FIG. 5C with an interconnect element 511 connecting the metal layer 505 of the solar cell and the stand-off element 511. The interconnect element 511 is substantially planar with a serpentine shape so as to provide stress relief that may be occasioned by the separate movement of the solar cell and the stand-off element 511.

Figure 7:
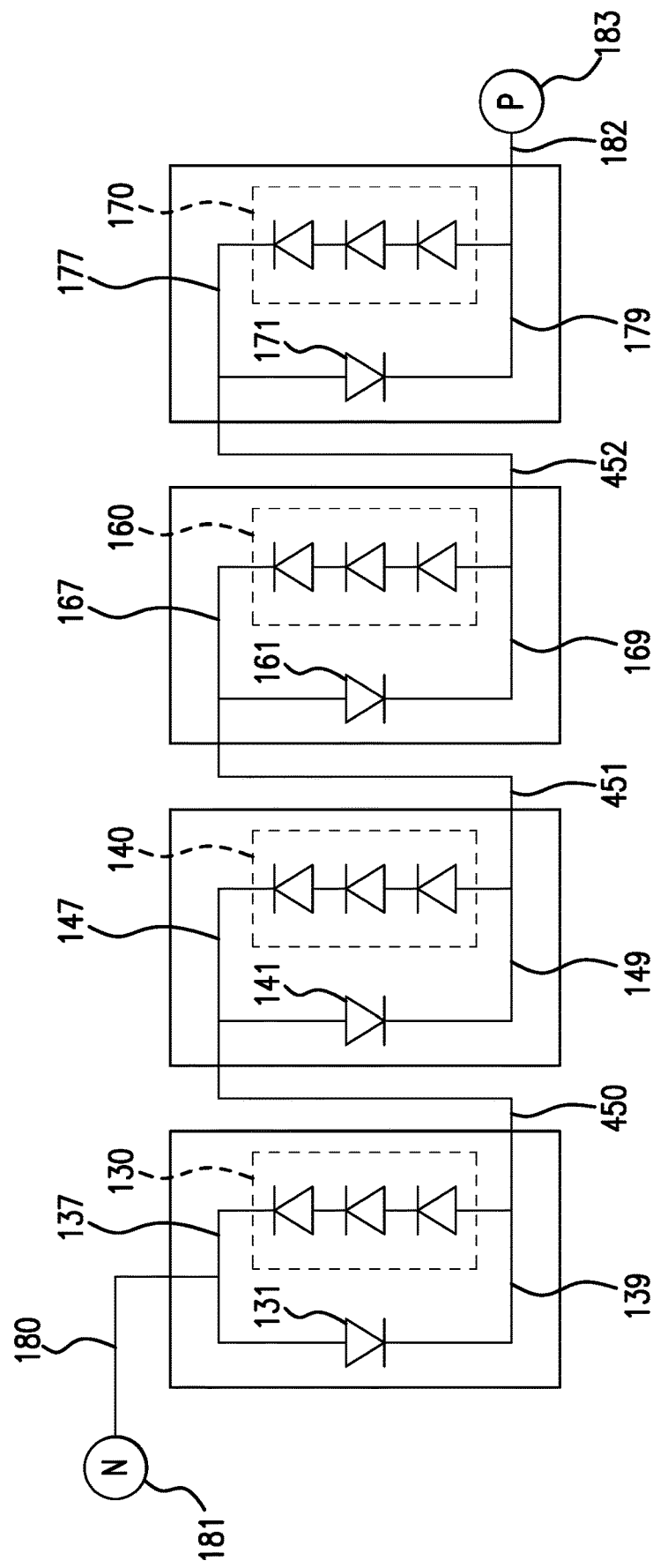
FIG. 7 is a schematic diagram of an array of four solar cells of FIGS. 4A and 4B with all of the solar cells connected in series.

FIG. 7 is a schematic diagram of an array of four solar cells 130, 140, 160 and 170 of FIGS. 4A and 4B with all of the solar cells connected in series between the N terminal 181 and the P terminal 183.

In some embodiments of the disclosure, the solar cells can be of the type described in U.S. patent application Ser. No. 12/218,582 filed Jul. 18, 2008, hereby incorporated by reference.

Thus, while the description of the semiconductor device described in the present disclosure has focused primarily on solar cells or photovoltaic devices, persons skilled in the art know that other optoelectronic devices, such as thermophotovoltaic (TPV) cells, photodetectors and light-emitting diodes (LEDS), are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand LEDs can also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

Without further analysis, from the foregoing others can, by applying current knowledge, readily adapt the present invention for various applications. Such adaptations should and are intended to be comprehended within the meaning and range of equivalence of the following claims.

The invention claimed is:

1. A solar cell assembly comprising:
    (a) a multijunction semiconductor solar cell including: a top or light receiving surface;
        a first edge;
        a second edge parallel to and opposite the first edge; a third edge orthogonal to the first edge;
        a fourth edge parallel to and opposite the third edge and orthogonal to the first edge; wherein a bounding rectangle is defined by lines extending along the first edge, the second edge, the third edge and the fourth edge;
        a fifth edge adjacent to the first edge and the third edge, having a length shorter than the first edge;
        a sixth edge adjacent to the second edge and the third edge, having a length shorter than the first edge;
        a seventh edge adjacent to the second edge and the fourth edge and having a length shorter than the second edge;
        an eighth edge adjacent to the first edge and the fourth edge and having a length shorter than the first edge;
        a bottom or back surface, opposite to the top surf ace, including an electrical contact of a first polarity type;
    (b) a first stand-off component disposed adjacent to the sixth edge; and
    (c) a second stand-off component disposed adjacent to the eighth edge; wherein the first stand-off component and the second stand-off component are disposed entirely within the bounding rectangle.

2. A solar cell assembly as defined in claim 1, further comprising:
    a third stand-off component disposed adjacent to the fifth edge, and within the bounding rectangle.

3. A solar cell assembly as defined in claim 1, further comprising a bypass diode disposed adjacent to the eighth edge and having a first edge that is collinear with the first edge of the solar cell, the bypass diode being electrically connected in parallel with the solar cell.

4. A solar cell assembly as defined in claim 1, further comprising:
    a plurality of grid lines extending over the top surface of the solar cell;
    a first bus bar disposed on the top surface of the solar cell and conductively connected to a first set of said grid lines and having a first portion extending substantially parallel to and proximate to the second edge of the solar cell; and
    an electrical interconnect coupling a second portion of the first bus bar with a top surface of the first stand-off component.

5. A solar cell assembly as defined in claim 4, further comprising:

a second bus bar disposed on the top surface of the solar cell and conductively connected to a second set of said grid lines and having a first portion extending substantially parallel to and proximate to the first edge of the solar cell; and an electrical interconnect coupling a second portion of the second bus bar with a top surface of the third stand-off component.

6. A solar cell assembly as defined in claim 1, wherein each of the first and second stand-off components extends from the top surface of the solar cell to the bottom surface of the solar cell and each forms a first and second respective electrical contacts of a second polarity type on the bottom surface of the assembly.

7. A solar cell assembly as defined in claim 1, wherein the stand-off components are composed of a highly doped semiconductor material.

8. A solar cell assembly as defined in claim 7, wherein the stand-off components are composed of gallium arsenide.

9. A solar cell assembly as defined in claim 1, wherein the grid lines are arranged parallel to one another and substantially orthogonal to the first and second bus bars.

10. A solar cell assembly as defined in claim 1, wherein there is no bus bar along the first and second edges of the solar cell.

11. A solar cell assembly as defined in claim 6, wherein at least one of the stand-off components is a discrete semiconductor element substantially shaped as a square having a side length from 2 to 25 mm and a height from 120 to 150 microns.

12. A solar cell assembly as defined in claim 5, wherein the stand-off components are disposed in opposite corners of the solar cell.

13. A solar cell as defined in claim 1, further comprising a bypass diode disposed adjacent to one of the corners of the solar cell.

14. A solar cell assembly as defined in claim 13, wherein the bypass diode is triangular in shape having a first external edge that is collinear with one of the first, second, third or fourth edges of the solar cell and having a second external edge that is collinear with the edge of one of the fifth, sixth, seventh or eighth edges of the cell.

15. A solar cell assembly as defined in claim 11, wherein the discrete semiconductor element has first and second end surfaces which are metallized with a metal to a thickness of approximately 5 microns to form a contact or bonding pad.

16. A solar cell assembly as defined in claim 1, wherein the first, second, third and fourth edges are all of equal length, and the fifth, sixth, seventh and eighth edges are all of equal length and smaller than that of the first edge.

17. A solar cell assembly as defined in claim 2, further comprising a fourth stand-off component disposed adjacent to the seventh edge and within the bounding rectangle.

18. A solar cell assembly as defined in claim 5, wherein the first set of grid lines are electrically separate from the second set of grid lines.

19. A back contact solar cell assembly comprising:
(a) a multijunction semiconductor solar cell including: a top or light receiving surface;
a plurality of grid lines extending over the top surface of the solar cell;
a bottom or back surface, opposite to the top surface, including an electrical contact of a first polarity;
a first bus bar disposed on the top surface of the solar cell and conductively connected to a first set of said grid lines and having a first portion extending substantially parallel to and proximate a second edge of the solar cell;
a second bus bar disposed on the top surface of the solar cell and spaced apart and distinct from the first bus bar, the second bus bar being conductively connected to a second set of grid lines and having a first portion extending substantially parallel to and proximate to a first edge of the solar cell;
(b) a first discrete conductive stand-off component spaced apart from the solar cell and proximate to the first bus bar and electrically coupled thereto, the first stand-off component extending from the top surface of the solar cell to the bottom surface of the solar cell to form a first electrical contact of a second polarity type on the bottom of the assembly; and
(c) a second discrete conductive stand-off component spaced apart from the solar cell and proximate to the second bus bas and electrically coupled thereto, the second stand-off component extending from the top surface of the solar cell to the bottom surface of the solar cell to form a second electrical contact of a second polarity type on the bottom of the assembly,
wherein each of the first and second discrete conductive stand-off components is a discrete semiconductor element substantially shaped as a square having a side length from 2 to 25 mm and a height from 120 to 150 microns.

\* \* \* \* \*